United States Patent [19]

Cheon

[11] Patent Number: 5,214,396
[45] Date of Patent: May 25, 1993

[54] METHOD AND APPARATUS FOR PROVIDING A BIPHASE MODULATED SIGNAL HAVING FLAT ENVELOPE CHARACTERISTICS WITHOUT A DIRECT CURRENT COMPONENT

[75] Inventor: Byoung-Jin Cheon, Suwon, Rep. of Korea

[73] Assignee: SamSung Electronics Co., Ltd., Suwon, Rep. of Korea

[21] Appl. No.: 805,647

[22] Filed: Dec. 12, 1991

[30] Foreign Application Priority Data

Jan. 25, 1991 [KR] Rep. of Korea .................. 1991-1299

[51] Int. Cl.$^5$ .......................... H03C 3/00; H03K 7/04; H04L 27/20
[52] U.S. Cl. .................... 332/104; 332/103; 375/55; 375/67
[58] Field of Search ................. 332/103, 104; 375/52, 375/55, 67

[56] References Cited

U.S. PATENT DOCUMENTS 4,736,389  4/1988  Debus, Jr. et al. ............. 332/104 X
5,049,839  9/1991  Jun ...................... 332/103

*Primary Examiner*—David Mis
*Attorney, Agent, or Firm*—Robert E. Bushnell

[57] ABSTRACT

A biphase shift keying modulation circuit includes: a clock pulse generator for generating system clock pulses; a random data generating unit for dividing the frequency of the system clock pulses to generate random digital data in synchronism with the divided clock pulses; a data conversion circuit for sequentially shifting the random digital data in synchronism with the system clock pulses and generating parallel shifted data which is multiplied by given resistive values and added to each other to provide an in-phase signal component, and for processing the shifted data and random digital data to provide a quadrature-phase signal component without a direct current component; a carrier wave oscillator for generating a carrier wave signal; and a modulating circuit for modulating the in-phase signal component and quadrature-phase signal component with the carrier wave signal and ninety degree phase-shifted carrier wave, respectively, in which the modulated signals are added to provide a phase modulated signal of flat envelope characteristics.

21 Claims, 5 Drawing Sheets

METHOD AND APPARATUS FOR PROVIDING A BIPHASE MODULATED SIGNAL HAVING FLAT ENVELOPE CHARACTERISTICS WITHOUT A DIRECT CURRENT COMPONENT

BACKGROUND OF THE INVENTION

The present invention relates to a biphase shift keying modulation circuit, and more particularly to a circuit for converting random digital data into an in-phase signal component and quadrature phase signal component which are modulated respectively at carrier waves of 90° different phases and added to each other so as to provide a signal of flat envelope characteristics.

FIG. 1 shows a conventional circuit, wherein a data generating unit 200 divides the frequency of the system clock pulses "a" through a system clock input terminal 100 so as to provide random data in synchronism with the system clock pulses. The frequency-divided random data from the data generating unit 200 is synchronized with the system clock pulses "a" by a data conversion circuit 300 to produce stepped in-phase and quadrature phase signal components. A carrier wave generator 170 generates a carrier wave. A modulator circuit 400 modulates the in-phase and quadrature phase signal components of the data conversion circuit 300 respectively at a carrier wave and the carrier wave shifted by 90° into double and single balanced signals that are combined so as to generate a signal of flat envelope characteristics. The modulated signal from the modulator circuit 400 is amplified by an amplifier 220 to class C. The amplified signal from the amplifier 220 is transmitted through an antenna ANT.

The data generating unit 200 has a frequency divider 110 for dividing the frequency of the system clock pulses "a" by a given frequency division rate, and a random data generator 120 for receiving the output of the frequency divider 110 to provide random digital data "c".

A data conversion circuit 300 has a shift register 130, a first resistor array 140, a gate array 150, and a second resistor array 160. The shift register 130 receives the frequency-divided signal from the data generator 120 in series and delays the signal at a given number of times by a given period, in order to simultaneously produce all the delayed signals in parallel. The parallel signals D0-D7 from the shift register 130 are respectively multiplied by a given value of the first resistor array 140 and added to each other, to provide an in-phase signal component "l". In addition, assuming that one of the parallel signals from the shift register 130 is Dj, Dj and D(N−j+1)(N is the number of the parallel signal outputs from the shift register 130, and j = 1, 2, ..., N/2) are XORed via the gate array 150 of exclusive-OR gates. The signals from the gate array 150 are respectively multiplied by given values of a second resistor array 160 and added to each other, to provide a quadrature phase signal component "q".

The modulation circuit 400 has a carrier wave generator 170 for generating a carrier wave, a first multiplier 180 for multiplying the in-phase signal component with the carrier from the carrier wave generator 70 to perform a double balanced modulation, a phase shifter 190 for shifting the carrier from the carrier wave generator 170 by 90°, a second multiplier 230 for multiplying the quadrature phase signal component with the phase-shifted carrier from the phase shifter 190 to perform a single balanced modulation balanced only for the quadrature phase signal component, and an adder 210 for adding the signal from the first multiplier 180 to the signal from the second multiplier 230. The first and second resistor arrays 140 and 160 have a plurality of resistors R1-R14, and the gate array 150 has a plurality of XOR gates G1-G4. This prior art is disclosed in a Korea Patent Application No. 90-15940.

The waveforms of the parts of FIG. 1 are shown in FIG. 2, wherein waveform "a" illustrates the system clock pulses, waveform "b" the system clock pulses divided by the frequency divider 110, waveform "c" the signal from the random data generator 120, waveforms "d" and "k" the random data shifted by the shift register 130 in synchronism with the system clock pulses "a", waveform "l" the in-phase data obtained by multiplying the waveforms "d" to "k" from the shift register 130 through the first resistor array 140 by given values and adding the multiplied waveforms, waveform "m" the signal obtained by XORing the waveforms "d" and "k" via a XOR gate, waveform "n" the signal obtained by XORing the waveforms "e" and "j" via XOR gates, waveform "o" the signal obtained by XORing the waveforms "f" and "i" via XOR gates, waveform "p" the signal obtained by XORing the waveforms "g" and "h" via XOR gates, waveform "q" quadrature phase data obtained by multiplying the waveforms "m" and "p" from the gate array 150 through the second resistor array 160 by given values and adding the multiplied waveforms, waveform "r" the signal obtained by multiplying the waveform "l" at the carrier wave, waveform "s" the signal obtained by multiplying the waveform "q" with the carrier signal shifted 90°, and waveform "t" the modulated signal obtained by adding the waveform "r" to the waveform "s".

The operation of the conventional circuit is illustrated hereinafter. The frequency divider 110 divides the frequency of the system clock pulses "a" through the input terminal 100 by a given frequency division rate as shown in waveform "b" of FIG. 2. The waveform "b" from the frequency divider 110 is applied to the random data generator 120 to generate random digital data as shown in waveform "c" of FIG. 2. Meanwhile, the shift register 130 of the data conversion circuit 300 receives the waveform "c" from the random data generator 120 through an input terminal Di and shifts the waveform "c" according to the system clock pulses "a", to generate signals as shown in waveforms "d" to "k" of FIG. 2 through output terminals D0 to D7. In this case, the signal from the terminal D0 is obtained by once delaying the signal "c". Likewise, the signal from the terminal D2 is obtained by once delaying the signal from the terminal D1. In this way, the signal from the terminals D3 to D7 are respectively obtained by sequentially delaying the signals from the terminals D0 and D2. As a result, the signal from the terminal D7 is obtained by eight times delaying the waveform "c" from the random data generator 120. The output timing of the output terminals D0 to D7 is synchronized with the system clock pulses "a" so as to simultaneously generate the signals. The first resistor array 140 multiplies the signals from the shift register 130 respectively by the resistors R1-R9, and adds the multiplied signals to provide the in-phase signal component shown as waveform "l" of FIG. 2. The gate array 150 XORs the signals from the output terminal Dj of the shift register 130, i.e., XORs the signals from the output terminals D(N−j+1)(N is the number of the parallel output terminals, j=1, 2, ..., N/2) and Dj via the XOR gates G1-G4. The signals from the gate array 150 are respectively multiplied by the resistors R10 to R13, and the multiplied signals are added to each other to provide the quadrature phase signal component as shown in waveform "q" of FIG. 2.

Assuming that the in-phase and quadrature phase signal components are functions of time labeled respectively I(t) and Q(t), a modulated signal should satisfy the relationship $[I(t)]^2+[Q(t)]^2=C$ (C is a constant) in order to have flat envelope characteristics. The resistances of the first and second resistor arrays 140 and 160 may be respectively determined so as to maintain the relationship.

The carrier wave generator 170 generates the carrier wave that is multiplied by the waveform "l" from the first resistor array 140 in double balanced modulation via the first multiplier 180 of the modulator circuit 400 to produce a signal as shown in waveform "r" of FIG. 2. Further, the second multiplier 230 multiplies the signal from the phase shifter 190 and the waveform "q" from the second resistor array in single balanced modulation to produce a signal as shown in waveform "s" of FIG. 2. The adder 210 adds the waveform "r" from the first multiplier 180 to waveform "s" from the second multiplier 230 to produce the biphase shift keying modulated signal with flat envelope characteristics as shown in waveform "t" of FIG. 2, which biphase shift keying signal may be sufficiently amplified even in class C so as to be transmitted through the antenna ANT to the receiver.

However, since the second multiplier 230 is a single balanced modulator that is balanced for the carrier wave but not for the data, receiving the data with a direct current component as shown in the waveform "q" of FIG. 2 produces a signal with the carrier frequency component and harmonic component therearound, which is analyzed by a spectrum analyzer to show the spikes as shown in FIG. 3A. This may cause energy loss and impair other frequency regions in data transmission.

SUMMARY OF THE INVENTION

It is an object of the present invention to provide a circuit for eliminating the spikes appearing on the output frequency spectrum in biphase shift keying modulation.

It is another object of the present invention to provide a digital modulation circuit with flat envelope characteristics.

It is still another object of the present invention to provide a circuit for providing a uniform level of all signals at all times in an envelope of a signal including a phase transition area or zero crossing area, in biphase shift keying modulation so that the signals have flat envelope characteristics to prevent distortion at a phase shifting point during power amplification, especially for driving a Class C power amplifier.

According to an aspect of the present invention, a clock pulse generator generates system clock pulses and a data generating unit divides a frequency of the system clock pulses to generate random digital data in synchronism with the divided system clock pulses. A data conversion circuit sequentially shifts random digital data in synchronism with the system clock pulses and generates in parallel the shifted data to provide an in-phase signal component, and processes the shifted data to provide an in-phase signal component, and processes the shifted data and the random digital data to provide a quadrature-phase signal component without a direct current component. A carrier oscillator generates a carrier, and a modulator modulates the in-phase signal component and quadrature-phase signal component from the data conversion circuit respectively at the carrier and phase-shifted carrier and adds the modulated signals to each other, to provide a biphase modulated signal with flat envelope characteristics.

BRIEF DESCRIPTION OF THE ATTACHED DRAWINGS

For a better understanding of the invention and to show how the same may be carried into effect, reference will now be made, by way of example, to the accompanying diagrammatic drawings, in which.

DETAILED DESCRIPTION OF A PREFERRED EMBODIMENT

Figure 4:
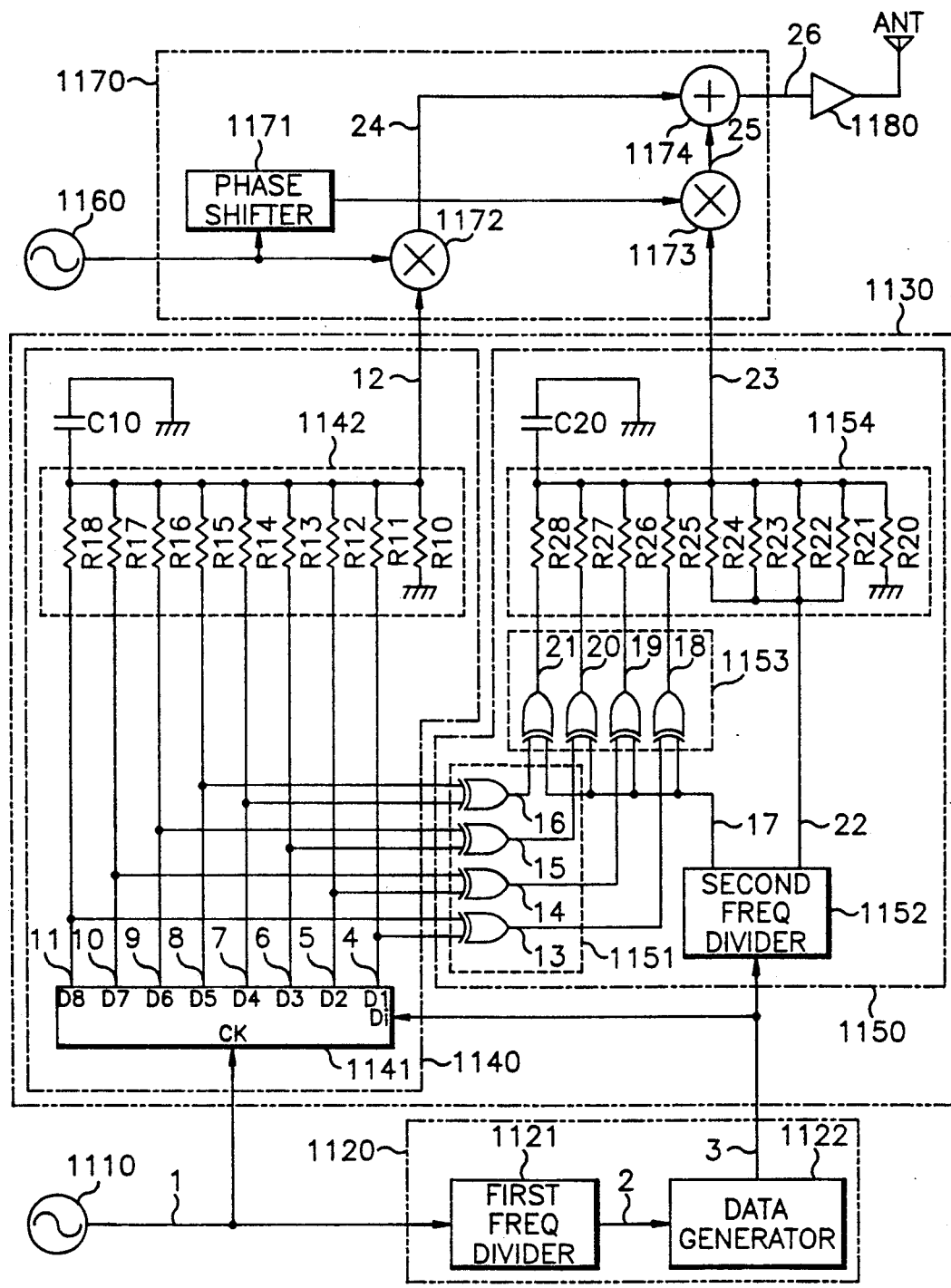
FIG. 4 is an inventive circuit of a preferred embodiment.

Referring to FIG. 4, a clock pulse generator 1110 generates system clock pulses 1, whose frequency is divided by a data generating unit 1120 to generate random digital data 3 in synchronism with the divided clock pulses 2. A data conversion circuit 1130 sequentially shifts the random digital data in synchronism with the system clock pulses from the clock pulse generator 1110 and generates in parallel the shifted data which are respectively multiplied by given values, and the shifted data is added to each other to provide an in-phase signal component 12, and processes the shifted data and random digital data 2 to provide a quadrature phase signal component 23. A carrier wave oscillator 1160 generates a carrier wave, and a modulator circuit 1170 modulates the in-phase and quadrature phase signal components from the data conversion circuit 1130 respectively at the carrier wave signal and 90° phase-shifted carrier wave, which modulated signals are added to each other to provide a biphase modulated signal with flat envelope characteristics. An amplifier 1180 amplifies the biphase modulated signal from the modulator circuit 1170 in class C, and the amplified signal is transmitted through an antenna ANT.

The data generating unit 1120 has a first frequency divider 1121 for dividing the frequency of the system clock pulses 1 by a given frequency division rate, and a random data generator 1122 for generating the random digital data 3 in synchronism with the divided clock pulses 2 from the first frequency divider 1121.

The data conversion circuit 1130 has an in-phase signal generator 1140 for sequentially shifting the random digital data from the data generating unit 1120 in synchronism with the system clock pulses and generating in parallel the shifted data which are respectively multiplied by given values of resistors R11-R18 and the multiplied data is added to each other to provide an in-phase signal component 12, and a quadrature phase signal generator 1150 for XORing signals from output terminals Dj (wherein j=1, 2, 3, ..., N/2, where N is the total number of output terminals) and D(N−j+1)

via a first XOR gate array 1151, dividing the frequency of the random data in a second frequency divider 1152 by a given frequency division rate to produce two frequency-divided signals 17 and 22 each being of opposite phase to one another, and further XORing the signals from the first XOR gate array 1151 and frequency-divided signal 17 via a second XOR gate array 1153 to produce signals that are multiplied by given values of resistors R25-R28 and added to frequency-divided signal 22 multiplied by given values of resistors R21-R24, to provide the quadrature phase signal component without a direct current component.

The modulator circuit 1170 has a phase shifter 1171 for shifting the phases of the carrier wave, a first modulator 1172 for modulating the in-phase signal component from the data conversion circuit 1130 at the carrier wave, a second modulator 1173 for modulating the quadrature phase signal component from the data conversion circuit 1130 with the phase-shifted carrier wave from the phase shifter 1171, and an adder 1174 for adding the modulated signal from the first modulator 1172 to the modulated signal from the second modulator 1173.

The in-phase signal generator 1140 has a serial/parallel converter 1141 for receiving the random data from the data generating unit 1120 through an input terminal Di, sequentially shifting the random data by a given period in synchronism with the system clock pulses and simultaneously generating the shifted data through output terminal Dj (here, j = 1, 2, 3, ..., N, N is an even number except zero) in synchronism with the system clock pulses in parallel, a first adding circuit 1142 for adding to each other the signals from the serial/parallel converter 1141 multiplied by the given values of resistors R11-R18 to provide the in-phase signal component 12, and a first noise eliminator C10 connected between the output of the first adding circuit 1142 and ground for eliminating the high frequency noise component contained in the signal from the first adding circuit 1142.

The quadrature phase signal generator 1150 has a first XOR gate array 1151 for XORing the signals from the output terminals Dj and D(N−j+1) (wherein j = 1, 2, 3, ..., N/2) of the serial/parallel converter 1141, a second frequency divider 1152 for dividing the frequency of the random data from the data generating unit 1120 by a frequency division rate to provide a first frequency divided signal 17 and a second frequency divided signal 22 each being of opposite phase with one another, a second XOR gate array 1153 for regularly inverting the signals from the first XOR gate array 1151 in synchronism with the first frequency-divided signal 17 from the second frequency divider 1152, a second adding circuit 1154 for multiplying the signals from the second XOR gate array 1153 and the second frequency-divided signal 22 by the given values of resistors R21-R24 and adding the multiplied signals to each other to provide the quadrature-phase signal component without a direct current component, and a second noise eliminator C20 connected between the output of the second adding circuit 1154 and ground for eliminating the high frequency noise component contained in the signal from the second adding circuit 1154.

Figure 5:
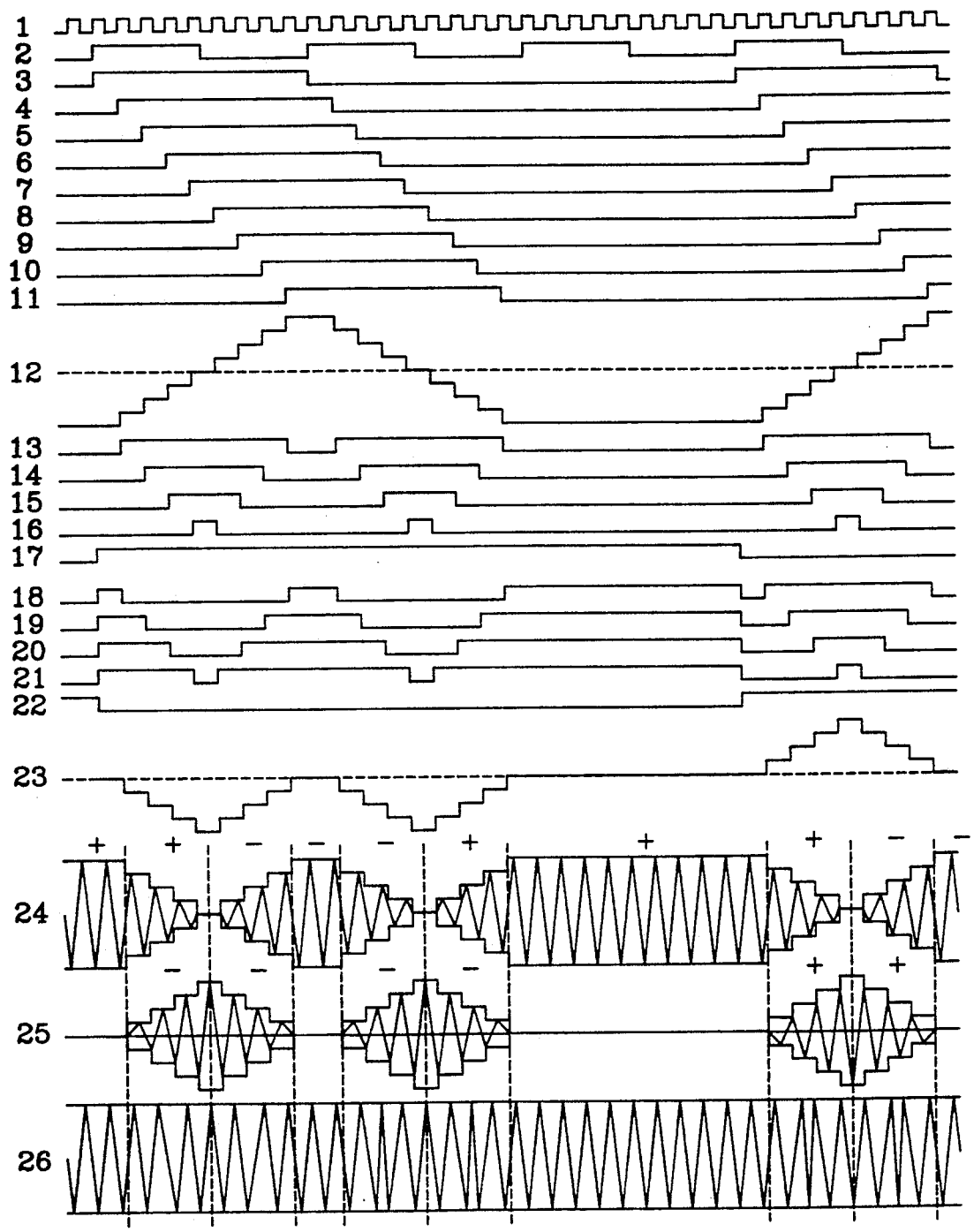
FIG. 5 illustrates the waveforms of the parts of FIG. 4.

The waveforms of FIG. 4 are described with reference to FIG. 5, wherein waveform 1 illustrates the system clock pulses generated by the clock pulse generator 1110, waveform 2 the signal obtained by dividing the system clock pulses 1 through the first frequency divider 1121, waveform 3 the random digital data that the random digital generator 1122 generates in synchronism with the signal 2 from the first frequency divider 1121, waveforms 4 and 11 the parallel signals that the serial/parallel converter 1141 produces by serially shifting the signal from the random data generator 1122, waveform 12 the in-phase signal that the first adding circuit 1142 generates by adding the signals from the serial/parallel converter 1141 which have been respectively multiplied by the given values of resistors R11-R18, waveforms 13 to 16 the signals that the first XOR gate array 1151 produced by XORing the signals from the output terminals Dj and $D_{(N-j+1)}$ of the serial/parallel converter (here, j = 1, 2, 3, ..., N/2, where N is the total number of output terminals), waveform 17 the first frequency-divided signal that the second frequency divider 1152 produces by dividing the frequency of the random data from the random data generator 1122, waveforms 18 to 21 the signals that the second gate array 1153 produces by XORing the first frequency-divided signal 17 from the second frequency divider 1152 and the signals from the first XOR gate array 1151, waveform 22 the second frequency-divided signal from the second frequency divider 1152, waveform 23 the quadrature-phase signal component that the second adding circuit 1154 produces by adding the signals 18 to 21 from the second XOR gate array 1153 and the second frequency-divided signal 22 respectively multiplied by the given values of resistors R21-R24, waveform 24 the signal that the first modulator 1172 produces by modulating the in-phase signal component 12 with the carrier wave from the carrier wave generator 1160, waveform 25 the signal obtained by modulating the quadrature-phase signal component 23 with the carrier wave phase-shifted by 90° from the phase shifter 1171, and waveform 26 the biphase modulated signal with flat envelope characteristics that the adder 1174 produces by adding the signal 24 from the first modulator 1172 to the signal 25 from the second modulator 1173. By the first and second noise eliminators C10 and C20, respectively, stepwise waveforms 12, 23, 24, and 25 of FIG. 5 are smoother in phase transition.

The data generating unit 1120 divides the frequency of the system clock pulses 1 to generate random digital data 3 in synchronism with the divided clock pulses 2. The serial/parallel converter 1141 of the data conversion circuit 1130 sequentially shifts the random digital data 3 in synchronism with the system clock pulses 1 and generates in parallel the shifted data 4 to 11 via output terminals D1-D8. The first adding circuit 1142 multiplies the parallel shifted data by the given value of resistors R11 to R18 and adds the multiplied signals to each other to provide an in-phase signal component 12.

In this case, the conductances of the resistors R11 and R18 of the first adding circuit 1142 are respectively G11 = 1/R11, G12 = 1/R12, ... G18 = 1/R18, and the signals from the serial/parallel converter 1141 are multiplied by the given conductance values of X11 = G11/(G11 + ... + G18), X12 = G12/(G11 + ... + G18), ..., X18 = G18/(G11 + ... + G18), respectively, which are added to each other to produce the in-phase signal component 12.

It is required that R11 = R18, R12 = R17, R13 = R16, and R14 = R15 so that X11 = X18, X12 = X17, X13 = X16, and X14 = X15 for the waveform of the in-phase signal component to have a same absolute value of the rising and falling shape. The in-phase signal component 12 has a step-like shape that may cause high frequency noise which is eliminated by the first noise eliminator C10.

The first gate array 1151 XORs the signals from the output terminals Dj and D(N−j+1) (here, j=1, 2, ... , N/2, where N is the total number of output terminals) among the signals 4 to 11 of the serial/parallel converter 1141 via the XOR-gates to produce the signals 13 to 16.

Figure 1:
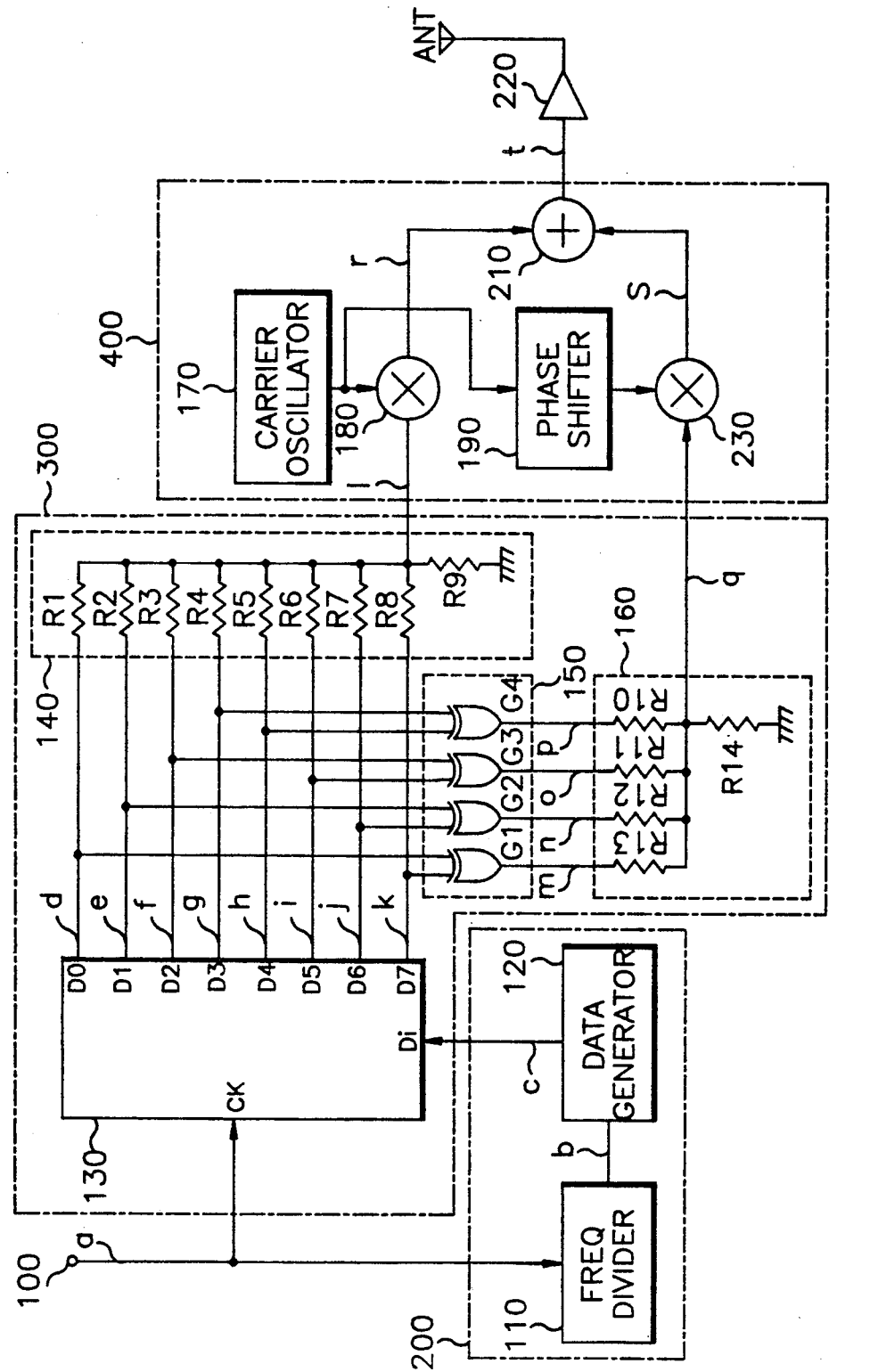
FIG. 1 is a conventional circuit.
Figure 2:
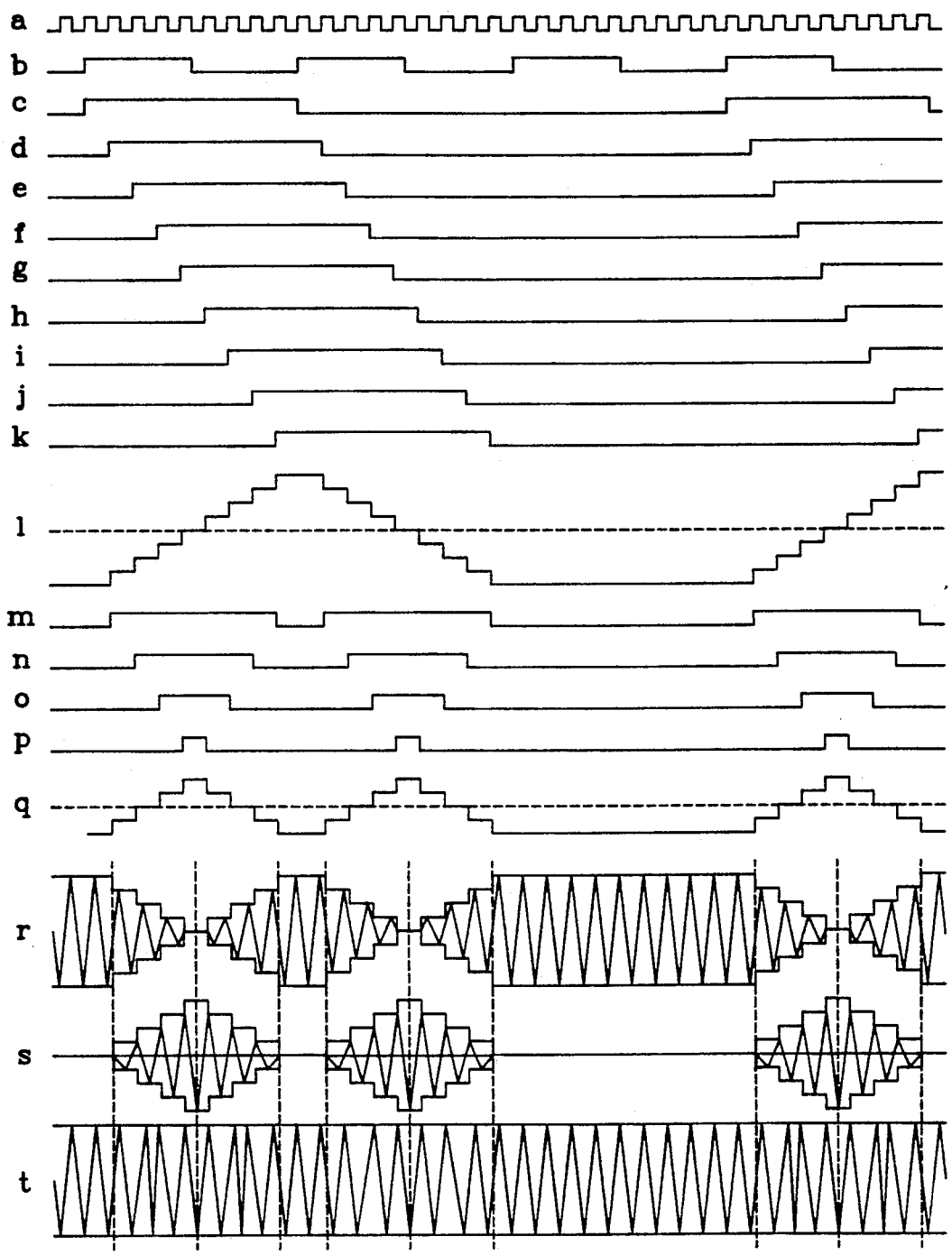
FIG. 2 illustrates the waveforms of the parts of FIG. 1.
Figure 3A:
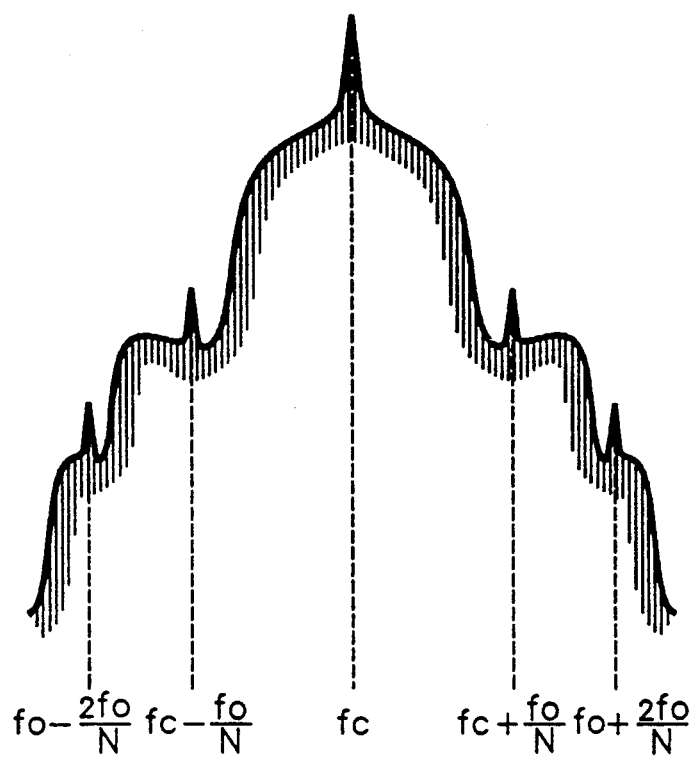
FIGS. 3A and 3B illustrate the frequency spectra of FIGS. 1 and 4, respectively.
Figure 3B:
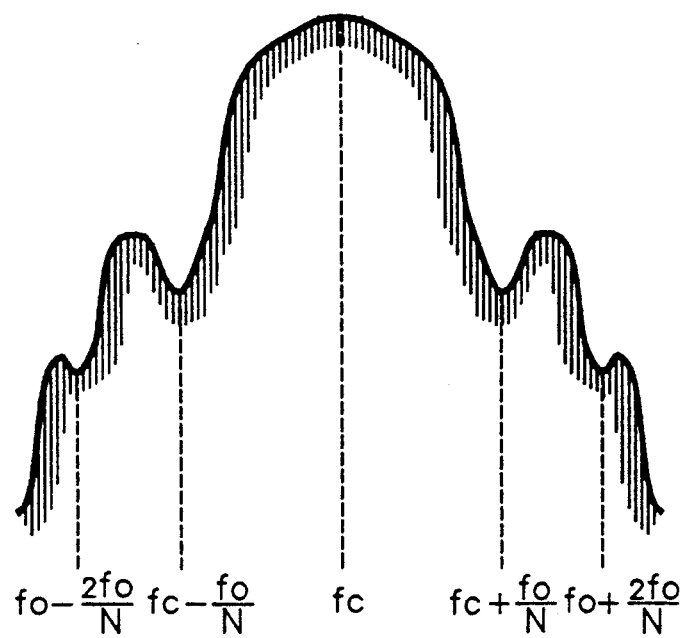

The second XOR gate array 1153 XORs the signals 13 to 16 and the first frequency-divided signal 17 from the second frequency divider 1152 via XOR-gates. The signals 18 to 21 and the second frequency-divided signal 22 generated by the second frequency divider 1152 are multiplied by the resistors R21 to R28 of the second adding circuit 1154 to provide the quadrature-phase signal component 23. This is the main point of the present invention, whereby the direct current component contained in the quadrature-phase signal component is eliminated together with the spikes in the frequency spectrum as shown in FIG. 3b.

The conductor values of the resistors R21 to R28 of the adding circuit 1154 are respectively $G21=1/R21$, $G22=1/R22, \ldots, G28=1/R28$. The given values Y21 to Y28 by which the adding circuit 1154 multiplies the signals 18 to 21 from the second XOR gate array 1153 and the second frequency-divided signal 22 have the following relationship: $Y21+Y22+Y23+Y24=(G21+G22+G23+G24)/(G21+G22+G23 \ldots +G28)$, $Y25=G25/(G21+G22+G23 \ldots +G28)$, $Y26=G26/(G21+G22+G23 \ldots +G28)$, $Y28=G28/(G21+G22+G23 \ldots +G28)$. In order to obtain a precise waveform, the resistors must have the following relationship: $R21+R22+R23+R24=R25+R26+R27+R28$. In this case, a single resistor can replace R21, R22, R23 and R24.

The in-phase and quadrature-phase components from the data conversion circuit 1130 are applied into the modulator circuit 1170, whose first and second modulators 1172 and 1173 respectively modulate the in-phase and quadrature-phase signal components with the carrier wave and 90° phase-shifted carrier wave. The adder 1174 of the modulator circuit 1170 adds the signal from the first modulator 1172 to the signal from the second modulator 1173 to complete biphase shift keying modulation with flat envelope characteristics.

As stated above, the inventive circuit provides biphase shift keying modulation with flat envelope characteristics, so that poor transmission does not occur in a zero crossing portion even when driving a C-class power amplifier and transmitting power through an antenna. Moreover, since there is no carrier and its harmonic components around the carrier frequency, undesirable power consumption is prevented in signal transmission and noise is impeded from other frequency regions.

While the invention has been particularly shown and described with reference to a preferred embodiment, it will be understood by those skilled in the art that modifications in detail may be made without departing from the spirit and scope of the invention.

What is claimed is:

1. A biphase shift-keying modulation circuit with flat envelope characteristics, comprising:
   clock pulse generator means for providing a system clock pulse by generating a clock pulse signal;
   data generating means connected to said clock pulse generator means, for serially generating random digital data D(t), where t is a value of time, in synchronism with a frequency-divided system clock pulse by dividing a frequency of said system clock pulse;
   data conversion means connected to said data generating means, for providing parallel shifted data by sequentially shifting said random digital data in synchronism with said system clock pulse, for generating an in-phase signal component by multiplying the parallel shifted data by resistive values of a first adding circuit and adding the multiplied data, and for providing a quadrature-phase signal component without a direct current component by adding a first processed signal generated by processing said parallel shifted data and a second processed signal generated by processing said random digital data from the data generating means;
   carrier oscillator means for providing a carrier by generating said carrier; and
   modulating means connected to said carrier oscillator means and data conversion means for providing a first modulated signal by modulating said in-phase signal component with said carrier and for providing a second modulated signal by modulating said quadrature-phase signal component with a phase-shifted carrier, and for providing a biphase modulated signal with flat envelope characteristics by adding the first and second modulated signals.

2. The biphase shift-keying modulation circuit of claim 1, further comprising amplifier means for providing an amplified biphase modulated signal by amplifying the biphase modulated signal from said modulating means.

3. The biphase shift-keying modulation circuit of claim 1, wherein said data generating means comprises:
   first frequency divider means for serially generating the frequency-divided system clock pulse by dividing the frequency of said system clock pulse by a first frequency division rate; and
   random data generator means connected to said first frequency divider means, for providing said random digital data by generating said random digital data in synchronism with said frequency-divided system clock pulse from said first frequency divider means.

4. The biphase shift-keying modulation circuit of claim 3, wherein said data conversion means comprises:
   in-phase signal generator means for providing sequentially shifted random digital data by sequentially shifting said random digital data from said data generating means in synchronism with said system clock pulse, for transferring said shifted random digital data by transferring said shifted random digital data through output terminals Dj for j=1, 2, 3, ... N, where N is an even number except zero, and for providing said in-phase signal component by multiplying the transferred shifted random digital data of each said output terminal by a corresponding given resistive value and adding the multiplied data; and
   quadrature-phase signal generator means for providing said quadrature-phase signal component without the direct current component by providing first XORed data from XORing the transferred shifted random digital data from said output terminals Dj and output terminals $D_{N-j+1}$, dividing a frequency of said random digital data by a second frequency division rate to produce first and second frequency-divided signals of said random digital data being of opposite phases, XORing the first XORed data with the first frequency-divided signal of said random digital data to provide second XORed signals, multiplying said second XORed signals and said second frequency-divided signal of said random digital data by predetermined resistive values and adding the multiplied data.

5. The biphase shift-keying modulation circuit of claim 1, wherein said modulating means further comprises:
    phase shifter means for providing a phase shifted carrier by shifting a phase of said carrier;
    first modulator means for providing the first modulated signal by modulating said in-phase signal component from said data conversion circuit with said carrier;
    second modulator means for providing the second modulated signal by modulating said quadrature-phase signal component from said data conversion circuit with said phase-shifted carrier from said phase shifter means; and
    adder means for providing the biphase modulated signal by adding the first and second modulated signals.

6. The biphase shift-keying modulation circuit of claim 4, wherein said in-phase signal generator means comprises:
    serial/parallel converter means for providing the shifted random digital data by sequentially shifting said random digital data in parallel to the output terminals Dj in response to said system clock pulse;
    first adding means connected to said serial/parallel converter means, for providing the in-phase signal component by multiplying the shifted random digital data by given resistive values and adding the multiplied data; and
    first noise eliminator means connected between an output of said first adding means and ground, for providing a first noise-free in-phase signal component by eliminating high frequency noise contained in said in-phase signal component.

7. The biphase shift-keying modulation circuit of claim 4, wherein said quadrature-phase signal generator means comprises:
    XOR-gate array means connected to output terminals Dj, for providing said first XORed data by XORing the transferred shifted random digital data from said output terminals Dj and said output terminals $D_{N-j+1}$;
    second frequency divider means for providing the first and second frequency-divided signals of said random digital data being of opposite phase by dividing the frequency of the random digital data from said data generating circuit by said second frequency division rate;
    inverting means connected to said XOR-gate array means and said second frequency divider means, for providing inverted XORed data by inverting the first XORed data in synchronism with the first frequency-divided signal of said random digital data from said second frequency divider;
    adding means connected to said inverting means and second frequency divider means, for providing said quadrature-phase signal component without the direct current component by multiplying the inverted XORed data and said second frequency-divided signal of said random digital data by the predetermined resistive values and adding the multiplied data; and
    noise eliminator means connected between an output of said adding means and ground, for providing a noise-free quadrature-phase signal component by eliminating a high frequency component of said quadrature-phase signal component.

8. The biphase shift-keying modulation circuit of claim 2, wherein said amplifier means has C class capability.

9. The biphase shift-keying modulation circuit of claim 5, wherein said phase shifter means provides a ninety degree phase shift.

10. The biphase shift-keying modulation circuit of claim 4, further comprising means for adjusting said in-phase signal component by providing a predetermined constant value equal to a sum of a squared value of the in-phase signal component and a squared value of said quadrature-phase signal component.

11. A biphase shift-keying modulation circuit with flat envelope characteristics having clock pulse generator means for providing system clock pulses by generating a system clock signal, data generating means for providing random digital data in synchronism with divided system clock pulses by serially generating the random digital data in response to the divided system clock pulses, carrier oscillator means for providing a carrier by generating a carrier, and modulating means for providing a first modulated signal by modulating an in-phase signal component with the carrier and for providing a second modulated signal by modulating a quadrature-phase signal component with a phase-shifted carrier, comprising:
    means connected to said data generating means, for providing said in-phase signal component by sequentially shifting said random digital data in parallel in synchronism with said system clock pulses; and
    means for providing said quadrature-phase signal component without a direct current component by adding a first processed signal produced by processing said sequentially shifted random digital data and a second processed signal produced by processing said random digital data.

12. A biphase shift-keying modulation circuit, comprising:
    data generating means for providing random data by dividing a frequency of a clock pulse and generating said random data in response to the frequency-divided clock pulse;
    in-phase signal generating means for providing an in-phase signal component of a biphase modulated signal without a direct current component and having flat envelope characteristics, by sequentially shifting said random data in synchronism with the clock pulse, multiplying the shifted random data by first predetermined values to provide first multiplied signals, and adding said multiplied signals;
    quadrature-phase generating means for providing a quadrature-phase signal component, without the direct current component, of the biphase modulated signal by frequency-dividing the random data to provide first and second frequency-divided signals, gating the shifted random data to provide first gated signals, gating the first gated signals with the first frequency-divided signal to provide second gated signals, multiplying each second gated signal by second predetermined values to provide second multiplied signals, multiplying the second frequency-divided signal by third predetermined values to provide third multiplied signals, and adding the second and third multiplied signals; and modulating means for providing the biphase modulated signal without the direct current component and with flat envelope characteristics, by modulating said in-phase signal component with a carrier to provide a first modulated signal, modulating said quadrature-phase signal component with a phase-shifted carrier to provide a second modulated signal, and adding the first and second modulated signals.

13. The biphase shift-keying modulation circuit of claim 12, wherein the modulating means comprises a ninety degree phase shifter for shifting the phase-shifted carrier to be ninety degrees out of phase with the carrier.

14. The biphase shift-keying modulation circuit of claim 12, wherein the quadrature-phase generating means comprises:
a first exclusive OR gate array gating the shifted random data to provide the first gated signals; and
a second exclusive OR gate array gating the first gated signals with the first frequency-divided signal to provide the second gated signals.

15. The biphase shift-keying modulation circuit of claim 12, wherein the quadrature-phase generating means comprises a resistor array establishing the second and third predetermined values.

16. The biphase shift-keying modulation circuit of claim 12, wherein the quadrature-phase generating means comprises a frequency divider dividing the random data to provide the first frequency-divided signal being one hundred eighty degrees out of phase with the second frequency-divided signal.

17. The biphase shift-keying modulation circuit of claim 12, further comprising a C class amplifier amplifying the biphase modulated signal without the direct current component and with flat envelope characteristics.

18. A biphase shift-keying modulation process, comprising the steps of:
providing random data by dividing a frequency of a clock pulse and generating said random data in response to the frequency-divided clock pulse;
providing an in-phase signal component of a biphase modulated signal without a direct current component and with flat envelope characteristics, by sequentially shifting said random data in synchronism with the clock pulse, multiplying the shifted random data by first predetermined values to provide first multiplied signals, and adding said multiplied signals;
providing a quadrature-phase signal component, without the direct current component, of the biphase modulated signal by frequency-dividing the random data to provide first and second frequency-divided signals, gating the shifted random data to provide first gated signals, gating the first gated signals with the first frequency-divided signal to provide second gated signals, multiplying said second gated signals by second predetermined values to provide second multiplied signals, multiplying the second frequency-divided signal by third predetermined values to provide third multiplied signals, and adding the second and third multiplied signals; and providing the biphase modulated signal without the direct current component and with flat envelope characteristics, by modulating said in-phase signal component with a carrier to provide a first modulated signal, modulating said quadrature-phase signal component with a phase-shifted carrier to provide a second modulated signal, and adding the first and second modulated signals.

19. A quadrature-phase signal generating circuit, comprising:
a frequency divider providing a first frequency-divided signal and a second frequency-divided signal being one hundred eighty degrees out of phase with the first frequency-divided signal, by frequency-dividing random data;
a first gate array providing first gated signals by gating shifted said random data;
a second gate array providing second gated signals by gating the first gated signals with the first frequency-divided signal; and
an adding circuit providing a quadrature-phase signal component, without a direct current component, of a biphase modulated signal having flat envelope characteristics by multiplying the second gated signals and the second frequency-divided signal by predetermined values and adding the multiplied signals.

20. A method of a quadrature-phase signal generating circuit, comprising the steps of:
providing a first frequency-divided signal and a second frequency-divided signal being one hundred eighty degrees out of phase with the first frequency-divided signal, by frequency-dividing random data;
providing first gated signals by gating shifted said random data;
providing second gated signals by gating the first gated signals with the first frequency-divided signal; and
providing a quadrature-phase signal component, without a direct current component, of a biphase modulated signal having flat envelope characteristics by multiplying the second gated signals and the second frequency-divided signal by predetermined values and adding the multiplied signals.

21. The biphase shift-keying modulation circuit of claim 1, wherein said data conversion means comprises:
in-phase signal generator means for producing said parallel shifted data represented as $D(t-jT)$ where $j=1, 2, \ldots N$, T is a period of the system clock pulse and N is a given integer at output terminals Dj, by shifting said random digital data $D(t)$ in a serial-in parallel-out shift register in synchronism with said system clock pulse, and for producing said in-phase signal component by multiplying the parallel shifted data $D(t-jT)$ of each said output terminal Dj by a corresponding given resistive value and adding the multiplied data, providing said in-phase signal component comprising a smooth waveshape; and quadrature-phase signal generator means for producing said quadrature-phase signal component without the direct current component by providing first XORed data from XORing the parallel shifted data $D(t-jT)$ with other shifted said random digital data represented as $D\{t-(N-j+1)T\}$, dividing a frequency of said random digital data D(t) by a given frequency rate producing a first frequency divided pulse having a first phase and a second frequency divided pulse having a second phase, said first phase and said second phase being one-hundred-eighty degrees out of phase, providing second XORed data by XORing said first XORed data with the first frequency divided pulse, multiplying said second XORed data and said second frequency divided pulse by predetermined resistive values, said quadrature-phase signal component comprising a waveshape compensating the in-phase signal component in a phase transition area being a zero-crossing area, where an amplitude of the in-phase signal component is reducing.

* * * * *